United States Patent
Abessolo Bidzo et al.

(10) Patent No.: US 12,206,237 B2
(45) Date of Patent: Jan. 21, 2025

(54) SEMICONDUCTOR DIE WITH TRANSFORMER AND ESD CLAMP CIRCUIT

(71) Applicant: NXP B.V., Eindhoven (NL)

(72) Inventors: Dolphin Abessolo Bidzo, Nijmegen (NL); Shailesh Kulkarni, Heverlee (BE); Juan Felipe Osorio Tamayo, Eindhoven (NL)

(73) Assignee: NXP B.V., Eindhoven (NL)

( * ) Notice: Subject to any disclaimer, the term of this patent is extended or adjusted under 35 U.S.C. 154(b) by 182 days.

(21) Appl. No.: 17/938,151

(22) Filed: Oct. 5, 2022

(65) Prior Publication Data

US 2024/0120734 A1    Apr. 11, 2024

(51) Int. Cl.
*H02H 9/04* (2006.01)
*H01F 27/28* (2006.01)

(52) U.S. Cl.
CPC ............ *H02H 9/046* (2013.01); *H01F 27/28* (2013.01)

(58) Field of Classification Search
CPC ................. H02H 9/046; H01F 27/28
See application file for complete search history.

(56) References Cited

U.S. PATENT DOCUMENTS

| | | | |
|---|---|---|---|
| 6,897,729 B1 | 5/2005 | Jin et al. | |
| 7,894,173 B2 | 2/2011 | Deng et al. | |
| 8,213,142 B2 | 7/2012 | Worley | |
| 8,493,705 B2 | 7/2013 | Lin et al. | |
| 8,942,760 B2 | 1/2015 | De Maaijer | |
| 9,276,400 B2 | 3/2016 | Kanemaru | |
| 9,525,452 B2 | 12/2016 | You | |
| 9,735,145 B2 | 8/2017 | Dupuis et al. | |
| 9,806,521 B2 | 10/2017 | Khazhinsky et al. | |
| 11,380,993 B2 | 7/2022 | Bellaouar | |
| 2011/0267725 A1* | 11/2011 | Scuderi | H01L 27/0255 361/56 |
| 2014/0185167 A1* | 7/2014 | Peng | H02H 9/046 361/56 |
| 2015/0236008 A1* | 8/2015 | Werthmann | H01L 29/868 438/597 |
| 2015/0289360 A1* | 10/2015 | Leong | H05K 1/181 361/782 |
| 2016/0126725 A1 | 5/2016 | Khazhinsky et al. | |
| 2016/0268978 A1 | 9/2016 | Matsuno | |

OTHER PUBLICATIONS

Lin, C., "ESD Protection Design for Gigahertz Differential LNA in a 65-nm CMOS Process", 2015 Asia-Pacific Symposium on Electromagnetic Compatibility Systems (ISCAS), May 26-29, 2015.
Moreno, L., "A Low-Power RF Front-End for 2.5 GHz Receivers", 2008 IEEE International Symposium on Circuits and Systems (ISCAS), May 18-21, 2008.

\* cited by examiner

*Primary Examiner* — Scott Bauer
(74) *Attorney, Agent, or Firm* — David G. Dolezal (57) ABSTRACT

A semiconductor die includes a transformer with terminals of a first winding electrically coupled to external die terminals of the semiconductor die. The terminals of a second winding of the transformer are coupled to internal circuitry of the semiconductor die. An ESD clamp circuit is electrically coupled to the center tap of the second winding of the transformer. When made conductive during and ESD event, the ESD clamp circuit discharges ESD current between the center tap and a supply rail.

22 Claims, 5 Drawing Sheets

SEMICONDUCTOR DIE WITH TRANSFORMER AND ESD CLAMP CIRCUIT

BACKGROUND OF THE INVENTION

Field of the Invention

This invention relates in general to a semiconductor die with a transformer and ESD clamp circuit.

Description of the Related Art

Some semiconductor die utilize electrostatic discharge (ESD) circuitry for discharging charge from an ESD event affecting an external die terminal. An ESD event may occur when a charged object (e.g., a human finger) inadvertently contacts a conductive surface of a semiconductor die (e.g., a contact pad) or a conductive surface of a semiconductor die package coupled to the pad where charge at an elevated voltage is applied to the conductive surface due to the contact. Being at an elevated voltage, such charge may cause voltage differentials across the devices of the semiconductor die that may exceed their safe operating areas and damage those devices. An ESD event may also occur when a charged conductive surface of a die or package contacts an external object where charge is transferred between the conductive surface and the external object.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a semiconductor die includes a transformer with terminals of a first winding electrically coupled to external die terminals of the semiconductor die. The terminals of a second winding of the transformer are coupled to internal circuitry of the semiconductor die. An ESD clamp circuit is electrically coupled to the center tap of the second winding of the transformer. When made conductive during and ESD event, the ESD clamp circuit discharges ESD current between the center tap and a supply rail.

In one embodiment, the ESD clamp discharges ESD current flowing in the second winding of the transformer from an ESD event affecting an external die terminal coupled to a winding terminal of the transformer. Accordingly, the ESD clamp circuit can be used to protect internal circuitry of the semiconductor die electrically coupled to the second winding of the transformer from damage. In one embodiment, the transformer is used for ESD protection of an internal circuit (e.g., an amplifier) from ESD events affecting external die terminals receiving external signals to be processed by the internal circuitry.

Figure 1:
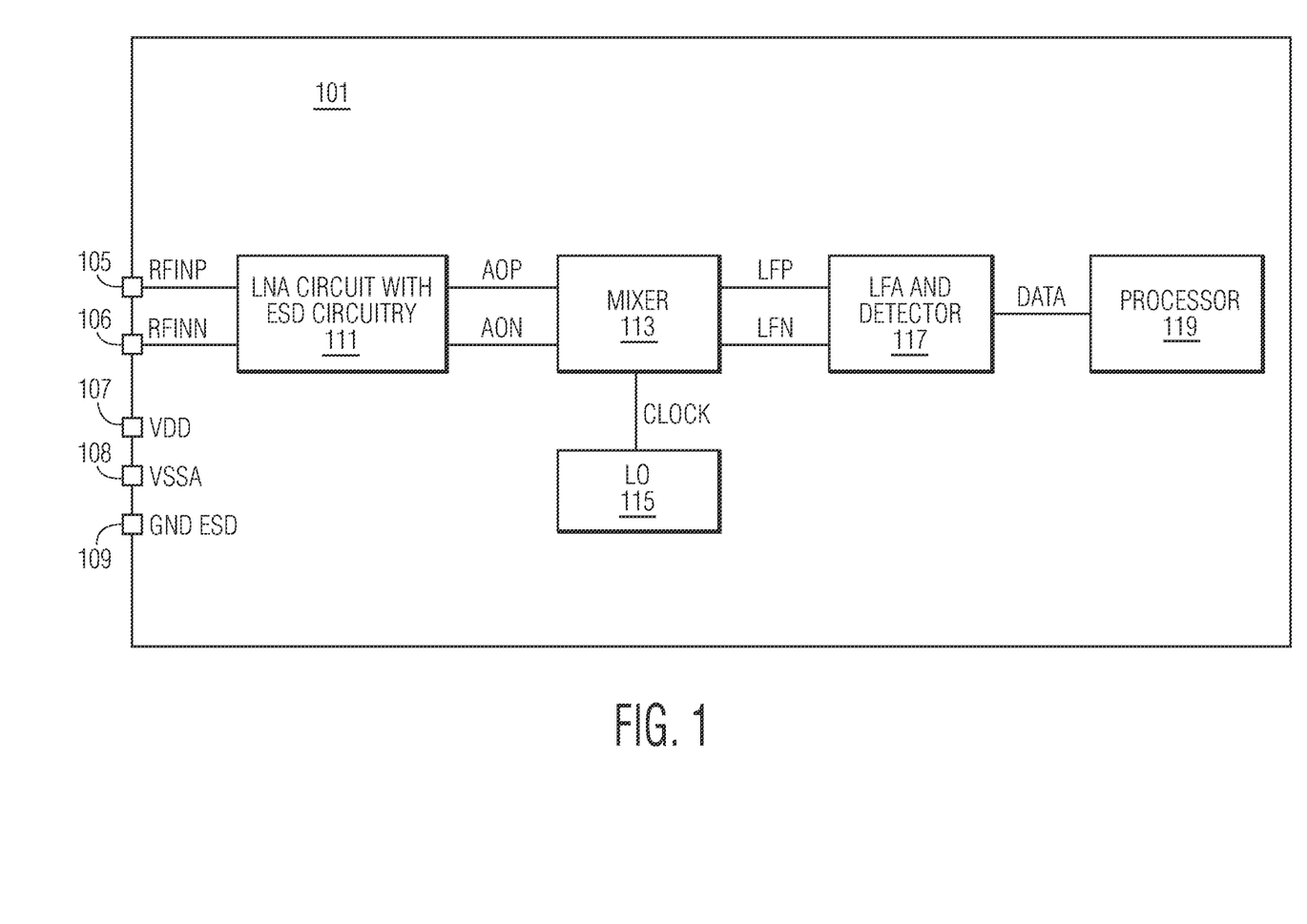
FIG. 1 is a block diagram of a receiver according to one embodiment of the present invention.

FIG. 1 is a block diagram of a semiconductor die 101 showing portions of a receiver circuit implemented therein. Die 101 includes external die terminals 105-109 for exchanging signals or receiving supply voltages from sources external to die 101. In one embodiment, die terminals 105-109 are implemented with die pads, but may be implemented with other types of external die terminals such as bumps or posts.

In some embodiments, die 101 is encapsulated with an encapsulate (e.g., molding compound, epoxy, or plastic (not shown)) to form a semiconductor die package where die 101 can be implemented in an electronic system such as automobile electronics, computer system, industrial control system, cellular phone, or communication device etc., depending upon the circuitry of die 101. The die terminals would be electrically connected to external terminals (not shown) of the die package (not shown) with conductive structures of the die package (e.g., bond wires, solder, traces, lead frame structures).

In the embodiment of FIG. 1, die 101 includes circuitry for implementing a receiver for receiving and processing a differential communication signal (RFINP and RFINN) at terminals 105 and 106, respectively. In one embodiment, terminals 105 and 106 are coupled to an antenna (not shown) that may be in the same package as the die 101 or may be external to the package of die 101. In one embodiment, the differential signal received at terminals 105 and 106 is modulated at a frequency in the Gigahertz range (e.g., in the range of 76-81 GHz). However, the signal may be modulated at other frequencies in other embodiments.

The differential input signal (RFINP and RFINN) is provided to a low noise amplifier (LNA) circuit 111. As will be described below with regard to FIG. 2, LNA circuit 111 includes an LNA amplifier 217 and ESD circuitry for protecting the circuitry of die 101 from damage due to an ESD even affecting terminals 105 or 106.

Die 101 includes a mixer 113 that mixes a low frequency clock signal (CLOCK) from low frequency oscillator (LO) 115 for converting the amplified differential output signals AOP, AON to a lower frequency differential signal (LFP, LFN) which is amplified and demodulated into a data signal (DATA) that is processed by processor 119. In other embodiments, a receiver may have other configurations in other embodiments. For example, it may include additional mixers and/or process non differential signals and include other types of amplifiers. Also, other types of circuitry such as transmitting circuitry may be implemented on die 101. In some embodiments, die 101 may implement other types of circuits other than a receiver.

Die 101 also includes external die terminals 107-109 for receiving supply voltages VDD, VSSA, and GND ESD, respectively. Die 101 may include other external die terminals (not shown) including other signal die terminals and supply voltage die terminals.

Figure 2:
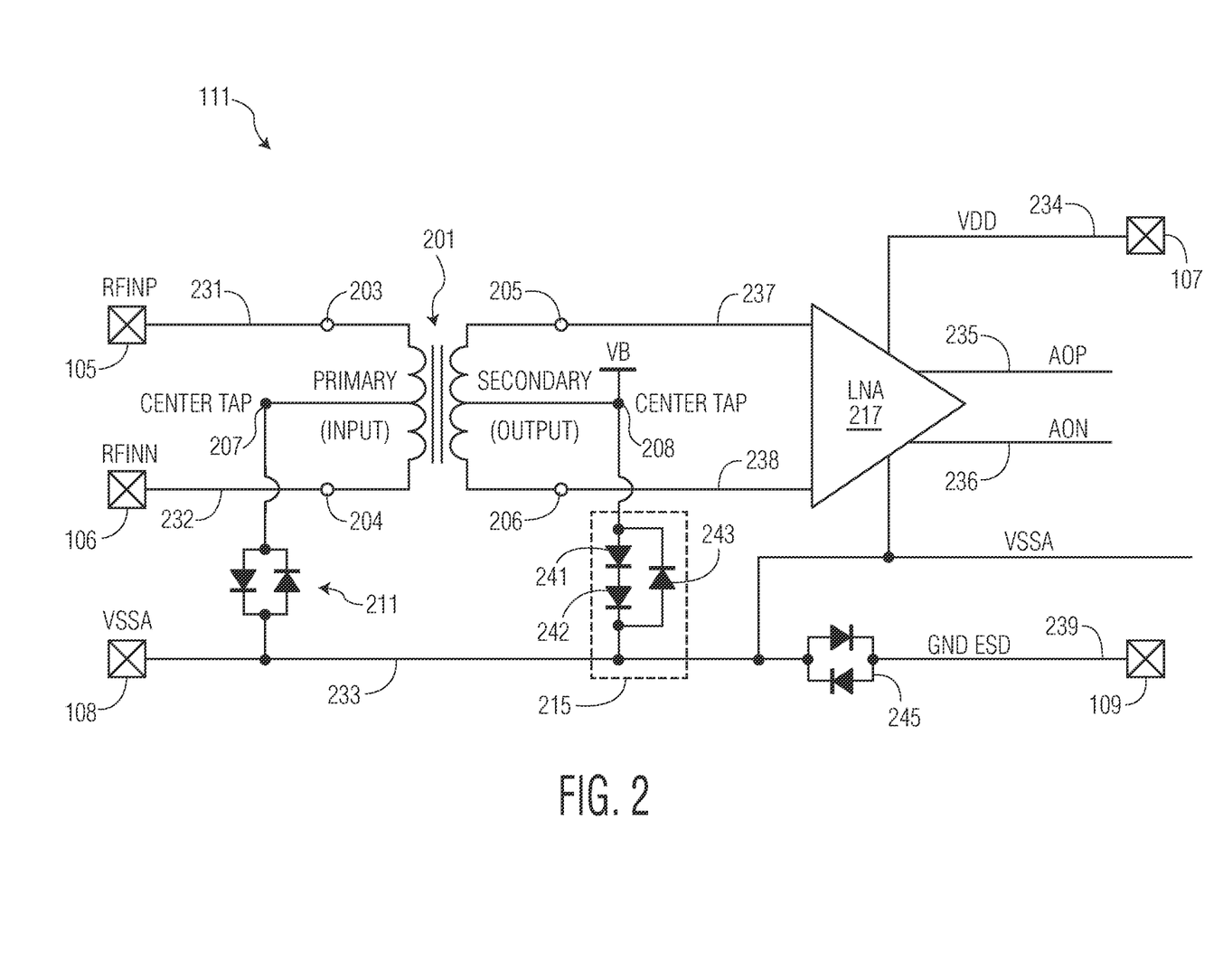
FIG. 2 is a circuit diagram of a transformer and an amplifier according to one embodiment of the present invention.

FIG. 2 is a circuit diagram of LNA circuit 111 accordingly to one embodiment. Circuit 111 includes a low noise amplifier 217 for producing an amplified differential signal AOP and AON on signal lines 235 and 236, respectively. Amplifier 217 is biased at its high supply terminal by rail 234 which is connected to VDD terminal 107. The low supply terminal of amplifier 217 is biased by rail 233 which is connected to VSSA terminal 108. In one embodiment, an ESD clamp circuit (not shown) is connected to both VDD rail 234 and VSSA rail 233 for discharging charge from an ESD event affecting either terminal 107 or 108. In one embodiment, the ESD clamp circuit (not shown) electrically coupled between rail 234 and rail 233 includes a relatively large field effect transistor (FET) and a diode coupled across the source and drains of the FET. In some embodiments, the clamp circuit may include a trigger circuit (not shown) for turning on the FET in response to an ESD event.

Rail 233 is coupled to an ESD ground (GND ESD) rail 239 by an ESD clamp circuit 245 for discharging charge from an ESD event affecting terminal 108 or terminal 109. In the embodiment shown, clamp circuit 245 is implemented with diodes in an anti-parallel configuration. Accordingly, if an ESD event affecting terminal 108 raises the voltage of rail 233 above the voltage of rail 239 (or vice versa) by a threshold voltage of clamp circuit 245, ESD charge will be discharged to the lower voltage bus. In one embodiment, the diodes of clamp circuit 245 are shallow trench isolation (STI) diodes. Ground rail 239 may traverse other locations of die 101 and may be coupled to other ground rails of other domains (not shown) by ESD clamp circuits (not shown) similar to ESD clamp circuit 245.

Circuit 111 includes circuitry for protecting LNA amplifier 217 from ESD events affecting terminals 105 and 106. In the embodiment shown, transformer 201 includes a primary side winding with input terminals 203 and 204 coupled through lines 231 and 232, respectively, to terminals 105 and 106, respectively. The center tap 207 of transformer 201 is connected to a first terminal of an ESD clamp circuit 211. The second terminal of ESD clamp circuit 211 is connected to VSSA rail 233. Consequently, charge from an ESD event affecting at least one of terminal 105 or 106, either elevating the voltage of that terminal above the voltage of rail 233 or dropping the voltage below the voltage of rail 233, will have a discharge path through the primary windings of transformer 201, through center tap 207, and through clamp circuit 211 to rail 233. An ESD event affecting a die terminal may include an ESD occurring at the die terminal or at package terminal coupled to the die terminal.

In the embodiment shown, clamp circuit 211 is implemented with two diodes in an antiparallel configuration, where the anode of one diode and the cathode of the other diode are connected to one clamp terminal and the cathode of the one diode and the anode of the other diode are connected to the other terminal of the clamp circuit. In one embodiment, the two diodes of clamp circuit 211 are implemented with gated diodes. In some embodiments, utilizing gated diodes in an ESD clamp circuit may provide for a relatively fast turn on ESD discharge voltage and reduced voltage overshoot for fast charge device model (CDM) transients. In addition, utilizing gated diode in an ESD clamp circuit may also provide for relatively good ESD robustness per input capacitance. However, other types of ESD clamp circuits can be utilized in other embodiments.

In the embodiment shown, center tap 208 is biased at reference voltage VB to set the common mode voltage of the differential inputs of LNA amplifier 217. In one embodiment, voltage VB is halfway between the voltage of VDD and the voltage of VSSA.

During an ESD event affecting terminal 105 or terminal 106, ESD charge on either of terminal 105 or 106 discharging to rail 233 through the primary winding of transformer 201 and clamp circuit 211 (or discharging from rail 233 to terminal 105 or 106), may generate a voltage across at least half of the secondary winding of transformer 201. Accordingly, to protect LNA 217 from damage due to such ESD events, an ESD clamp circuit 215 includes a terminal connected to the center tap 208 of the secondary winding of transformer 201 and a second terminal connected to supply rail 233 for providing a pathway for discharging ESD current that develops on the secondary winding from an ESD event that affects either terminal 105 or 106.

In the embodiment shown, clamp circuit 215 includes two diodes 241 and 242 coupled in series to provide a diode path for discharging ESD current from tap 208 to rail 233 when tap 208 is at a higher voltage than VSSA rail 233 during an ESD event by the threshold voltage of the diode path. The anode of diode 241 is connected to tap 208 and the cathode of diode 242 is connected to rail 233. The cathode of diode 241 is connected to the anode of diode 242. In one embodiment, two diodes (241 and 242) are positioned in series between tap 208 and rail 233 due to tap 208 being biased at VB (e.g., 600 mV) so to increase the voltage threshold of the clamp in the current direction and to reduce leakage current at higher temperatures when no ESD event is occurring.

Clamp circuit 215 also includes a diode 243 positioned in a diode path that is in an anti-parallel configuration with the diode path of diodes 241 and 242. Diode 243 provides a path for discharging ESD current from rail 233 to tap 208 when tap 208 is at a lower voltage than VSSA rail 233 during an ESD event by the threshold voltage of the diode path (e.g., the diode drop of diode 243). In one embodiment, diodes 241-243 are gated diodes that may provide for improved ESD performance in an ESD clamp circuit as described above.

In one embodiment, clamp circuits 211 and 215 has on resistance of approximately one ohm, but may be of other values in other embodiments. In one embodiment, clamp circuit 211 has a turn-on threshold voltage of 0.7 volts in both directions, whereas clamp circuit 215 has a turn-on voltage of 0.7 volts in one direction and 1.4 volts in the other direction due to diodes 241 and 242, however these voltages may be of other values in other embodiments.

In one embodiment, protecting LNA amplifier 217 from ESD events at its inputs with a transistor (201) whose taps are coupled to a supply rail with ESD clamp circuits may provide for an ESD protection scheme that has a relatively low parasitic capacitance and junction capacitance while minimizing input leakage for the high frequency signals (e.g., in the Gigahertz range). Such an ESD scheme may reduce the degradation of key RF parameters such as noise figure (NF), linearity (IIP1, IIP3), impedance matching (S11), and gain S21) over conventional ESD protection schemes. Implementing a clamp circuit (215) on the secondary tap (208) provides protection to the inputs of amplifier 217 from high voltages that may occur on the secondary windings due to an ESD event affecting terminals 105 and 106. Thus, such a center tap clamp circuit 215 may enable the use of a transformer for in an ESD protection scheme of an amplifier circuit in that it protects against an over voltage condition on a secondary side of the transformer 201.

Figure 3:
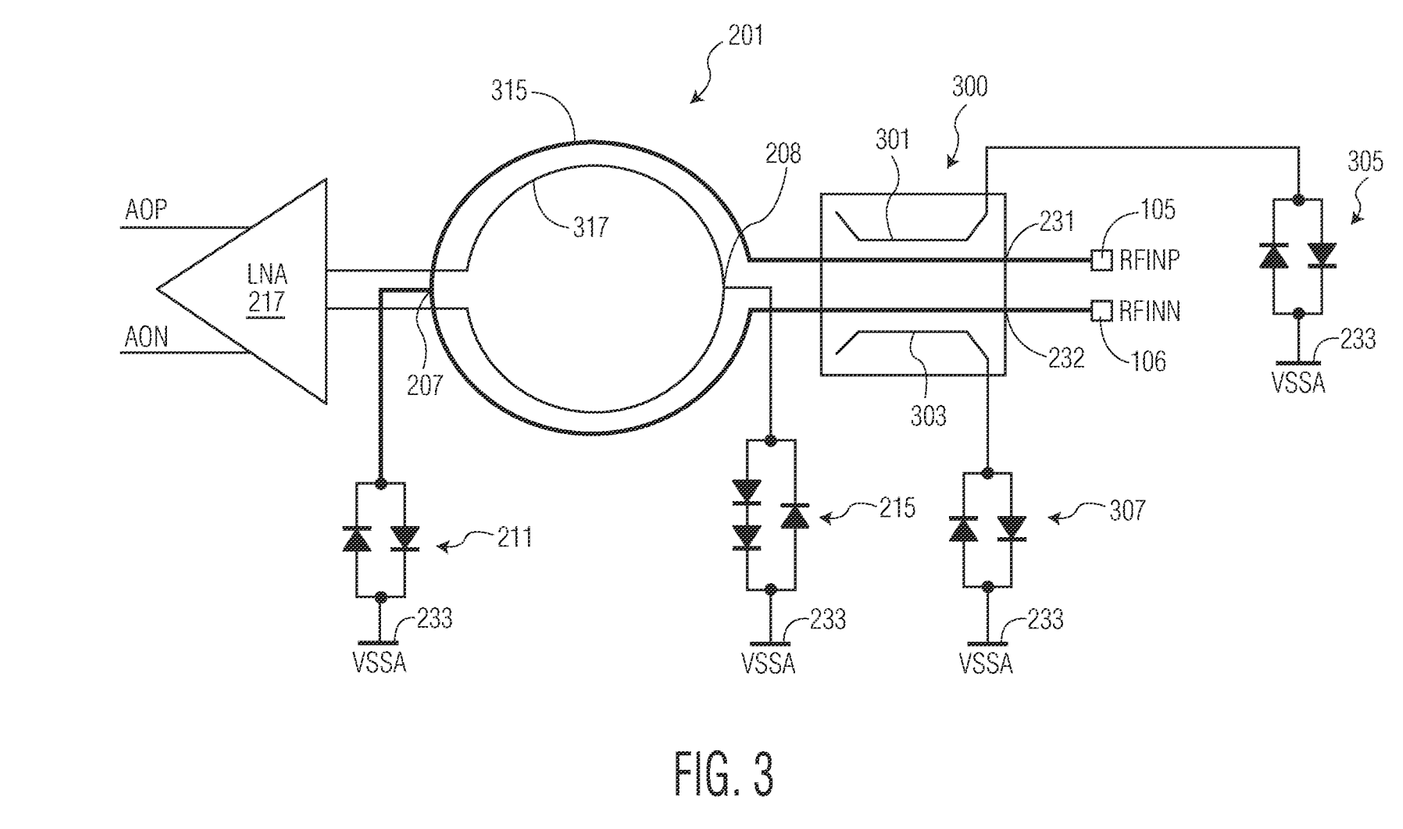
FIG. 3 is a circuit diagram of the circuit of FIG. 2 showing additional features according to one embodiment of the present invention.

FIG. 3 is another circuit diagram showing a portion of circuitry of die 101. In the embodiment of FIG. 3, the primary winding of transformer 201 is implemented with a circular signal line 315 around a circular signal line 317 that is used to implement the second winding of transformer 201.

In one embodiment, signal lines 315 and 317 are implemented in a metal layer (not shown) in die 101 that is located above the semiconductor substrate (not shown) of die 101. However, a transformer may be implemented in a semiconductor die with other structures in other embodiments.

In the embodiment shown, signal lines 231 and 232 are implemented with a co-planer wave guide 300 that includes directional couplers 301 and 303. Typically, a directional coupler is a device used for sampling incident and/or reflected power of a signal. In the embodiment shown, directional couplers 301 and 303 are each connected to an ESD clamp circuit 305 and 307, respectively, for discharging ESD current to VSSA rail 233 during an ESD event affecting terminal 105 or terminal 106 for protecting the directional couplers from damage. In the embodiment shown, clamp circuits 305 and 307 are implemented with gated diodes in an anti-parallel configuration, but other types of clamp circuits may be utilized in other embodiments. Other embodiments may not include clamp circuits 305 and 307.

In one embodiment, clamp circuit 211 is implemented in a solder ball breakage detection circuit (not shown) of the semiconductor die 101, but may be implemented in other circuits of die 101 in other embodiments.

Figure 4:
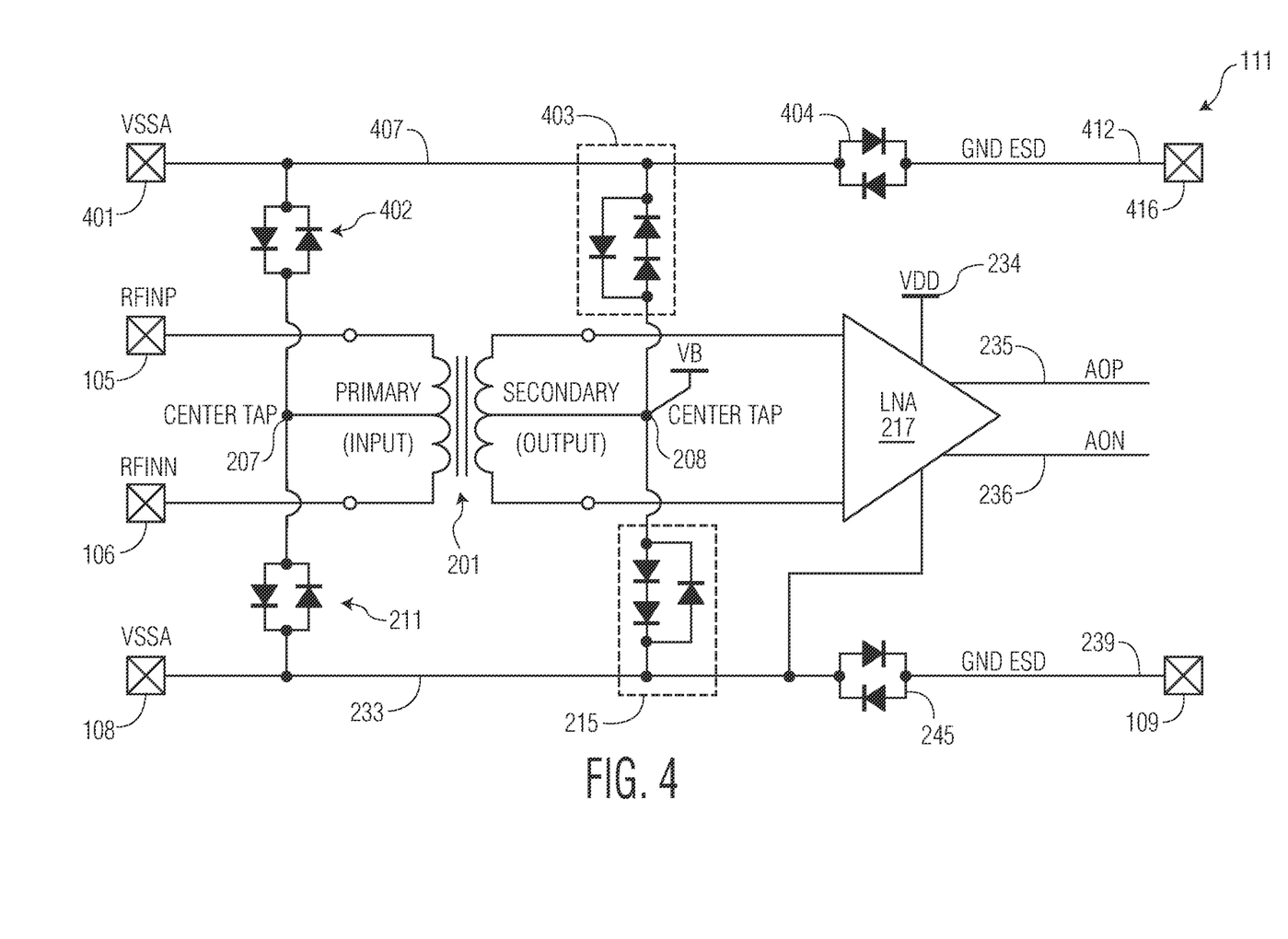
FIG. 4 is a circuit diagram of a transformer and an amplifier according to another embodiment of the present invention.

FIG. 4 is a circuit diagram of an LNA circuit 1 clamp 11 according to another embodiment. The items in the embodiment of FIG. 4 having the same reference numbers as the items in the embodiment of FIG. 2 are similar.

Circuit 211 of FIG. 4 is different than circuit 211 of FIG. 2 in that circuit 211 of FIG. 4 has an additional VSSA external die terminal 401, an additional VSSA rail 407, an additional ESD GND rail 412, and an additional GND ESD terminal 416. Terminal 401 is configured to be biased at the same supply voltage as terminal 108, and terminal 416 is configured to be biased at the same supply voltage as terminal 109. Rail 407 is coupled to rail 412 with an ESD clamp circuit 404 that is similar to ESD clamp circuit 245.

Center tap 207 is coupled to rail 407 with ESD clamp circuit 402, which in the embodiment shown in implemented with two diodes in an anti-parallel configuration. Center tap 208 is coupled to rail 407 with an ESD clamp circuit 403. In the embodiment shown, clamp circuit 403 has a configuration similar to clamp circuit 215. One advantage of having the additional VSSA rail, GND ESD rail 412, and ESD clamp circuits 402, 403, and 404 is that it provides additional path ways for discharging ESD current for an ESD event at terminals 105 and 106. An ESD clamp circuit (not shown) is coupled to VDD rail 234 and VSSA rail 407 for discharging ESD current between the two rails.

In FIGS. 2-4, the ESD clamp circuits 211, 215, 245, 305, 307, 402, 403, and 404 are implemented with diodes in an anti-parallel configuration. Although the Figures show the clamp circuits with diode paths of 1 or 2 diodes, other clamp circuits may include diode paths with a different number of diodes. Also, these ESD clamp circuits may be implemented with other types of ESD clamp circuits such as clamp circuits with a transistor (e.g., FETs, bipolar transistors).

Figure 5:
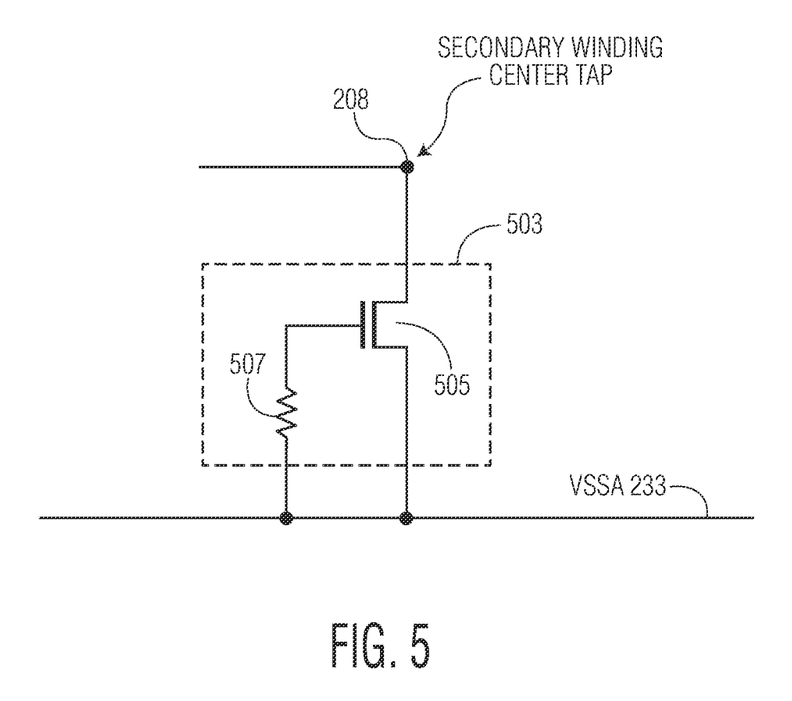
FIG. 5 is s circuit diagram of an ESD clamp circuit according to one embodiment of the present invention.

FIG. 5 is a circuit diagram of an ESD clamp circuit according to another embodiment of the present invention. Clamp circuit 503 can used for clamp circuit 215 of FIG. 2 and clamp circuit 403 of FIG. 4. Circuit 503 can also be used for circuits 211 and 402. In the embodiment shown, clamp circuit 503 includes an NFET 505 with a source connected to rail 233 and its drain connected to center tap 208. The gate of NFET 505 is coupled to rail 233 through a resistor 507. In one embodiment, resistor 507 is 500 ohms, but may be of other values in other embodiments, depending upon the desired threshold voltage of the clamp circuit. In one embodiment, clamp circuit 503 is characterized as having a grounded gate NMOS configuration. In one embodiment, the turn on threshold voltage of clamp circuit 503 is 3.1V.

Although the Figures show embodiments where transformer 201 is utilized for ESD protection, a transformer with a clamp circuit electrically coupling its secondary center tap to ground may be utilized in other types of circuits. For example, such a transformer may be used to step down or step up a supply voltage. Also, such a transformer may be used for ESD protection of non differential signal terminal inputs.

Also, in other circuits, the terminals of the secondary winding may be electrically coupled to external die terminals and the terminals of the primary winding may be coupled to internal circuitry. With such an embodiment, the primary center tap would be coupled to a supply rail with an ESD clamp circuit (e.g., similar to circuit 215) for ESD protection of the internal circuitry. Such a transformer may be used by a semiconductor die in providing an output signal (e.g., to an antennae for transmission). Also, such a transformer may be used by a power supply controller for externally providing a step up or step down supply voltage.

A source and drain are current terminals of a FET. A gate is a control terminal of a FET.

Features specifically shown or described with respect to one embodiment set forth herein may be implemented in other embodiments set forth herein.

In one embodiment, a semiconductor die includes a transformer including a first winding and a second winding. The first winding includes a first terminal electrically coupled to a first external die terminal and a second terminal electrically coupled to a second external die terminal. The second winding includes a third terminal, a fourth terminal, and a center tap. The third terminal and the fourth terminal are electrically coupled to internal circuitry of the semiconductor die. The semiconductor die includes an electrostatic discharge (ESD) clamp circuit including a fifth terminal electrically coupled to the center tap and a sixth terminal electrically coupled to a supply rail. The ESD clamp circuit when made conductive during an ESD event, discharges ESD current between the center tap and the supply rail.

In another embodiment, a semiconductor die includes a transformer including a primary winding and a secondary winding. The primary winding includes a first terminal electrically coupled to a first external die terminal, a second terminal electrically coupled to a second external die terminal, and a first center tap. The secondary winding includes a third terminal, a fourth terminal, and a second center tap. The semiconductor die includes a first electrostatic discharge (ESD) clamp circuit including a fifth terminal electrically coupled to the first center tap and a sixth terminal electrically coupled to a supply rail. When made conductive in response to an ESD event affecting at least one of the first external die terminal and the second external die terminal, the first ESD clamp circuit discharges ESD current between the first center tap and the supply rail. The semiconductor die includes a second ESD clamp circuit including a seventh terminal electrically coupled to the second center tap and an eighth terminal electrically coupled to the supply rail. When made conductive in response to the ESD event affecting at least one of the first external die terminal and the second external die terminal, the second ESD clamp circuit discharges ESD current between the second center tap and the supply rail.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A semiconductor die, comprising:
a transformer including a first winding and a second winding, wherein:
the first winding includes a first terminal electrically coupled to a first external die terminal and a second terminal electrically coupled to a second external die terminal; and
the second winding includes a third terminal, a fourth terminal, and a center tap, wherein:
the third terminal and the fourth terminal are electrically coupled to internal circuitry of the semiconductor die;
an electrostatic discharge (ESD) clamp circuit including a fifth terminal electrically coupled to the center tap and a sixth terminal electrically coupled to a supply rail, wherein the ESD clamp circuit when made conductive during an ESD event, discharges ESD current between the center tap and the supply rail;
a coplanar wave guide comprising:
a first signal line for providing a conductive path between the first external die terminal and the first terminal of the first winding;
a second signal line for providing a conductive path between the second external die terminal and the second terminal of the first winding;
a first directional coupler;
a second ESD clamp circuit electrically coupled to the first directional coupler including a seventh terminal electrically coupled to the first directional coupler and an eighth terminal electrically coupled to a supply rail, wherein the second ESD clamp circuit when made conductive during an ESD event, discharges ESD current between the first directional coupler and the supply rail.

2. The semiconductor die of claim 1, wherein the ESD clamp circuit is configured to discharge ESD current in response to an ESD event affecting at least one of the first external die terminal and the second external die terminal.

3. The semiconductor die of claim 1, wherein the first external die terminal and the second external die terminal are configured to receive a differential input signal.

4. The semiconductor die of claim 3 wherein differential input signal is modulated at a frequency in the Gigahertz range.

5. The semiconductor die of claim 1, wherein
the semiconductor die includes an amplifier;
the third terminal is electrically coupled to a first input of the amplifier the fourth terminal is electrically coupled to a second input of the amplifier.

6. The semiconductor die of claim 5, further comprising a mixer circuit including a first mixer input electrically coupled to a first output of the amplifier and a second mixer input electrically coupled to a second output of the amplifier, wherein the first output and the second output are configured to provide a differential signal modulated at a frequency in the Gigahertz range, and the mixer circuit is configured to produce a second differential signal based the differential signal that is modulated at a lower frequency than the differential signal.

7. The semiconductor die of claim 1, wherein the ESD clamp circuit includes a transistor and a resistor, wherein the transistor includes a first current terminal electrically coupled to the fifth terminal and a second current terminal electrically coupled to the sixth terminal, the transistor includes a control terminal, and wherein the resistor is coupled in a current path between the control terminal and the supply rail.

8. The semiconductor die of claim 1 wherein the first winding is characterized as a primary winding of the transformer and the second winding is characterized as a secondary winding of the transformer.

9. The semiconductor die of claim 1, wherein the ESD clamp circuit includes at least one diode in a first diode path and at least one diode in a second diode path wherein the first diode path and the second diode path are in an anti-parallel configuration.

10. The semiconductor die of claim 1 wherein:
the first winding includes a center tap;
the semiconductor die includes a second ESD clamp circuit including a seventh terminal electrically coupled to the center tap of the first winding and an eighth terminal electrically coupled to the supply rail, wherein the second ESD clamp circuit when made conductive during an ESD event affecting at least one of the first external die terminal and the second external die terminal, discharges ESD current between the center tap of the first winding and the supply rail.

11. A semiconductor die, comprising:
a transformer including a first winding and a second winding, wherein:
the first winding includes a first terminal electrically coupled to a first external die terminal and a second terminal electrically coupled to a second external die terminal; and
the second winding includes a third terminal, a fourth terminal, and a center tap, wherein:
the third terminal and the fourth terminal are electrically coupled to internal circuitry of the semiconductor die;
an electrostatic discharge (ESD) clamp circuit including a fifth terminal electrically coupled to the center tap and a sixth terminal electrically coupled to a supply rail, wherein the ESD clamp circuit when made conductive during an ESD event, discharges ESD current between the center tap and the supply rail;
wherein:
the center tap is configured to receive a biasing voltage; and
the ESD clamp circuit includes:
a first diode including a cathode electrically coupled to the fifth terminal and an anode electrically coupled to the sixth terminal; and
a second diode and a third diode coupled in series with a cathode of the second diode electrically connected to an anode of the third diode, wherein an anode of the second diode is electrically coupled to the fifth terminal and a cathode of the third diode is electrically coupled to the supply rail.

12. A semiconductor die, comprising:
a transformer including a first winding and a second winding, wherein:
the first winding includes a first terminal electrically coupled to a first external die terminal and a second terminal electrically coupled to a second external die terminal; and the second winding includes a third terminal, a fourth terminal, and a center tap, wherein:
the third terminal and the fourth terminal are electrically coupled to internal circuitry of the semiconductor die;
an electrostatic discharge (ESD) clamp circuit including a fifth terminal electrically coupled to the center tap and a sixth terminal electrically coupled to a supply rail, wherein the ESD clamp circuit when made conductive during an ESD event, discharges ESD current between the center tap and the supply rail;
wherein the semiconductor die further comprising a second ESD clamp circuit including a seventh terminal electrically coupled to the center tap and an eighth terminal electrically coupled to a second supply rail, wherein the supply rail and the second supply rail are configured to be biased at the same voltage, and wherein the second ESD clamp circuit when made conductive during an ESD event, discharges ESD current between the center tap to the second supply rail.

13. The semiconductor die of claim 12 wherein the center tap of the secondary winding is configured to receive a biasing voltage.

14. A semiconductor die, comprising:
a transformer including a primary winding and a secondary winding, wherein:
the primary winding includes a first terminal electrically coupled to a first external die terminal, a second terminal electrically coupled to a second external die terminal, and a first center tap; and
the secondary winding includes a third terminal, a fourth terminal, and a second center tap;
a first electrostatic discharge (ESD) clamp circuit including a fifth terminal electrically coupled to the first center tap and a sixth terminal electrically coupled to a supply rail, wherein when made conductive in response to an ESD event affecting at least one of the first external die terminal and the second external die terminal, the first ESD clamp circuit discharges ESD current between the first center tap and the supply rail; and
a second ESD clamp circuit including a seventh terminal electrically coupled to the second center tap and an eighth terminal electrically coupled to the supply rail, wherein when made conductive in response to the ESD event affecting at least one of the first external die terminal and the second external die terminal, the second ESD clamp circuit discharges ESD current between the second center tap and the supply rail;
wherein:
the second center tap of the secondary winding is configured to receive a biasing voltage; and
the second ESD clamp circuit includes:
a first diode including a cathode electrically coupled to the second center tap and an anode electrically coupled to the supply rail; and
a second diode and a third diode coupled in series with a cathode of the second diode electrically connected to an anode of the third diode, wherein an anode of the second diode is electrically coupled to the second center tap and a cathode of the third diode is electrically coupled to supply rail.

15. The semiconductor die of claim 14, wherein the first external die terminal and the second external die terminal are configured to receive a differential input signal.

16. The semiconductor die of claim 15 wherein the first external die terminal and the second external die terminal are configured to receive a differential input signal modulated at a frequency in the Gigahertz range.

17. A semiconductor die, comprising:
a transformer including a primary winding and a secondary winding, wherein:
the primary winding includes a first terminal electrically coupled to a first external die terminal, a second terminal electrically coupled to a second external die terminal, and a first center tap; and
the secondary winding includes a third terminal, a fourth terminal, and a second center tap:
a first electrostatic discharge (ESD) clamp circuit including a fifth terminal electrically coupled to the first center tap and a sixth terminal electrically coupled to a supply rail, wherein when made conductive in response to an ESD event affecting at least one of the first external die terminal and the second external die terminal, the first ESD clamp circuit discharges ESD current between the first center tap and the supply rail; and
a second ESD clamp circuit including a seventh terminal electrically coupled to the second center tap and an eighth terminal electrically coupled to the supply rail, wherein when made conductive in response to the ESD event affecting at least one of the first external die terminal and the second external die terminal, the second ESD clamp circuit discharges ESD current between the second center tap and the supply rail;
a third ESD clamp circuit including a ninth terminal electrically coupled to the second center tap and a tenth terminal electrically coupled to a second supply rail, wherein the supply rail and the second supply rail are configured to be biased at the same supply voltage, and wherein when made conductive in response to an ESD event affecting at least one of the first external die terminal and the second external die terminal, the third ESD clamp circuit discharges ESD current between the second center tap and the second supply rail;
a fourth ESD clamp circuit including an eleventh terminal electrically coupled to the first center tap and a twelfth terminal electrically coupled to the second supply rail, wherein when made conductive in response to an ESD event affecting at least one of the first external die terminal and the second external die terminal, the fourth ESD clamp circuit discharges ESD current between the first center tap and the second supply rail.

18. The semiconductor die of claim 17 further comprising:
a coplanar wave guide comprising:
a first signal line for providing a conductive path between the first external die terminal and the first terminal of the first winding;
a second signal line for providing a conductive path between the second external die terminal and the second terminal of the first winding;
a first directional coupler;
a fifth ESD clamp circuit electrically coupled to the first directional coupler including a thirteenth terminal electrically coupled to the first directional coupler and a fourteenth terminal electrically coupled to a supply rail, wherein the fifth ESD clamp circuit when made conductive during an ESD event, discharges ESD current between the first directional coupler and the supply rail.

19. The semiconductor die of claim 18, wherein:
the second center tap of the secondary winding is configured to receive a biasing voltage; and the second ESD clamp circuit includes:
- a first diode including a cathode electrically coupled to the second center tap and an anode electrically coupled to the supply rail; and
- a second diode and a third diode coupled in series with a cathode of the second diode electrically connected to an anode of the third diode, wherein an anode of the second diode is electrically coupled to the second center tap and a cathode of the third diode is electrically coupled to supply rail.

20. The semiconductor die of claim 17, further comprising:
an amplifier including a first input electrically coupled to the third terminal and a second input electrically coupled to the fourth terminal.

21. The semiconductor die of claim 20, further comprising:
a mixer circuit including a first mixer input electrically coupled to a first output of the amplifier and a second mixer input electrically coupled to a second output of the amplifier, wherein the first output and the second output are configured to provide a differential signal modulated at a frequency in the Gigahertz range, and the mixer circuit is configured to produce a second differential signal based on the differential signal that is modulated at a lower frequency than the differential signal.

22. The semiconductor die of claim 17 wherein the second center tap of the secondary winding is configured to receive a biasing voltage.

* * * * *